United States Patent [19]
Klein et al.

[11] 3,942,854
[45] Mar. 9, 1976

[54] HOLD DOWN DEVICE FOR USE IN ELECTRONIC SYSTEMS EMPLOYING INTEGRATED CIRCUITS

[75] Inventors: Peter P. Klein, Phoenixville; Robert E. Braun, Norristown, both of Pa.

[73] Assignee: Burroughs Corporation, Detroit, Mich.

[22] Filed: Oct. 9, 1974

[21] Appl. No.: 513,282

[52] U.S. Cl....... 339/17 CF; 339/75 MP; 339/91 R; 339/112 R; 339/119 R
[51] Int. Cl.² ......................................... H01K 1/12
[58] Field of Search.......... 339/17 C, 17 CF, 17 LC, 339/91 R, 75 R, 75 H, 75 MP, 17 LM, 17 M, 93 R, 103, 99, 119 R; 317/101 CC, 101 CP

[56] References Cited
UNITED STATES PATENTS

| | | | |
|---|---|---|---|
| 2,549,725 | 4/1951 | Uline et al. .................. | 339/91 R X |
| 2,650,948 | 9/1953 | Findlay .......................... | 339/99 R |
| 3,335,327 | 8/1967 | Damon et al. ............... | 339/17 CF X |
| 3,753,211 | 8/1973 | Pauza et al. .................... | 339/75 MP |
| 3,771,109 | 11/1973 | Bruckner et al. ............ | 339/17 CF X |

*Primary Examiner*—Joseph H. McGlynn
*Assistant Examiner*—Craig R. Feinberg
*Attorney, Agent, or Firm*—Francis A. Varallo; Edward J. Feeney, Jr.; Kevin R. Peterson

[57] ABSTRACT

A hold down device is described for applying a high clamping force to a "leadless" integrated circuit package installed in a suitable connector. Use of the device results in reliable electrical connections between the package circuit leads and the connector contact elements; and reliable thermal connections between the package carrier and a cooling frame provided to dissipate the heat generated by the integrated circuits. The hold down device has added system utility in the clamping of an interconnect cable assembly adapted to plug into the aforementioned connector in lieu of the integrated circuit package.

8 Claims, 8 Drawing Figures

HOLD DOWN DEVICE FOR USE IN ELECTRONIC SYSTEMS EMPLOYING INTEGRATED CIRCUITS

CROSS REFERENCE TO RELATED APPLICATION

In copending patent application Ser. No. 513,283 for "Packaging System for Electronic Equipment" by Robert E. Braun et al. there is described and claimed a packaging system utilizing leadless integrated circuit packages and in which, the hold down device of the present invention finds particular utility. The integrated circuits themselves may be packaged in the manner described and claimed in application Ser. No. 465,678 for "Leadless Ceramic Package for Integrated Circuit Having Heat Sink Means" by Robert S. Morse. Both of the foregoing referenced applications are assigned to the same assignee as the present application.

BACKGROUND OF THE INVENTION

The high density packaging of electronic equipment, particularly data processing systems may involve the installation of pluggable integrated circuit packages in receptacles or connectors. In addition, cooling means are generally required in such a system to maximize the MSI and LSI. Such means may take the form of a cooling frame.

The need exists for an efficient, low cost, universal hold down device to be used in conjunction with the aforementioned elements to insure both electrical and thermal integrity. The clamping device of the present invention fulfills such a need.

SUMMARY OF THE INVENTION

In accordance with the invention a hold down device is provided which is admirably suited for the high density packaging system described and claimed in the referenced Braun et al. application. This system involves an "island" which may be characterized as a plurality of pluggable integrated circuit packages, connectors or receptacles for receiving the packages, a cooling frame and an interconnection plate or medium which supports the other elements. It should be understood, however, that the reference system has been chosen solely for illustrative purposes and that the present device is not to be considered limited to use therein. In meeting the requirements of such a system, the hold down device of the present invention insures that electrical continuity is maintained between the circuit leads of the integrated circuit package (which may be of the "leadless" variety having no protruding leads) and the electrical contacts of the connector into which the package is plugged. Moreover, a thermal interface defined in terms of a specific pressure is provided by the device between the leadless integrated circuit package carrier (or heat sink member) and the cooling frame. The total force directed upon the package by the hold down device is therefore substantially the sum of the forces dictated by both the electrical and thermal considerations.

In addition to the foregoing, the hold down device is functional for the condition that only one integrated circuit section of the pair of sections comprising the so called "split-package" is installed in a standard connector capable of accommodating simultaneously both sections or a single full package. The device is mounted in such a manner that it is contained at all times, even in the presence of high insertion and release forces. At the same time it permits easy access to the connector for the removal or insertion of packages.

Other features of the device include its substantially unitary construction, which eliminates loose hardware; ease of assembly or replacement in the system; provision of permitting identification of the packages under restraint without removal of the device; and finally, its economy.

The physical characteristics of the present hold down device are best understood by reference to the detailed description of the invention which follows. However, in brief the device comprises a spring-like member, formed in a shallow, upright, truncated "V" configuration. In the center flat portion, the embodiment intended for use with integrated circuit packages has secured thereto a pressure plate. The latter has a number of formed protuberances which bear against the package heat sink member. The device is positioned between a pair of spaced apart parallel rods mounted on brackets in proximity to the cooling frame. One of the device extremities is permitted to pivot about one of the rods to permit access to the connector, but at the same time is restrained thereby. Its other extremity is capable of being latched about the other rod to apply a clamping force to the package. When arranged in rows and columns in an "island" configuration, the hold down devices assume a partial mating relationship wherein a given rod provides the latching means for a first row of devices and the pivot means for the next succeeding row. This arrangement affords considerable space economy.

Other features of the invention will become more fully apparent in the detailed description which follows.

DESCRIPTION OF THE PREFERRED EMBODIMENTS

Figure 1:
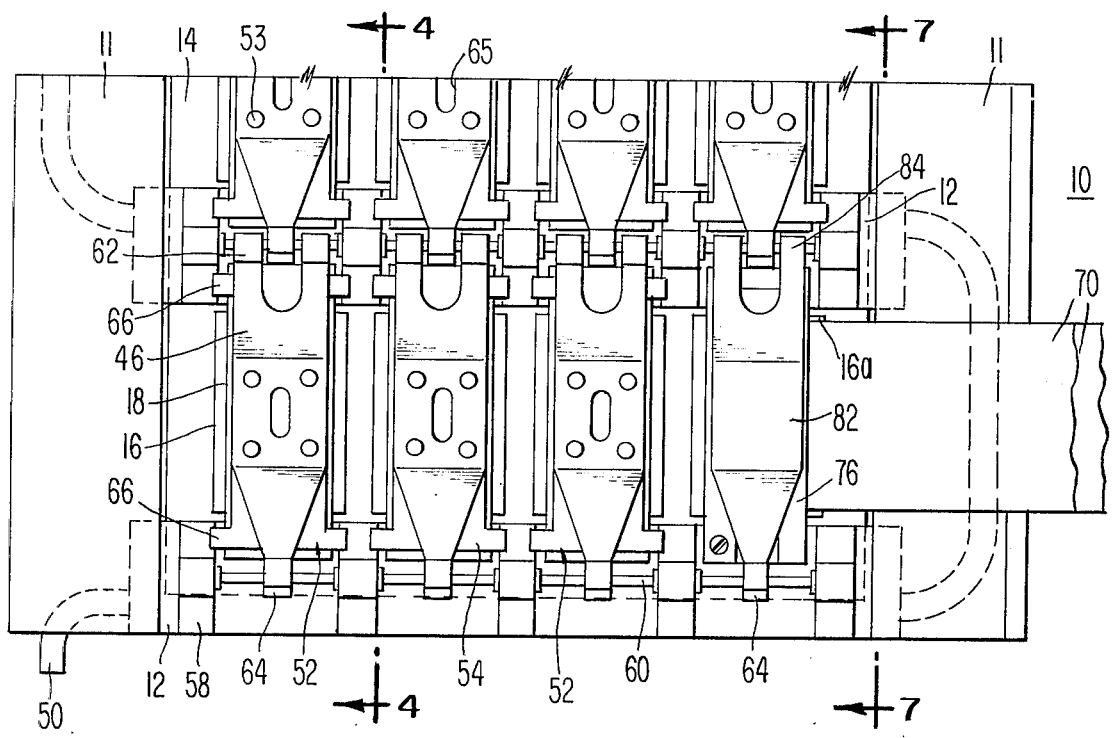
FIG. 1 is a partial plan view of an island illustrating a packaging system using the hold devices of the present invention.

The partial view of an overall packaging system appearing in FIG. 1 is described and claimed in the reference Braun et al. application. The hold down device of the present invention finds particular application in this system, and its features and advantages are best appreciated when considered in such an environment. The system details which follow are to be considered illustrative, rather than limitative of the invention.

General reference should be made to FIG. 1, and specific reference, to the other figures where indicated, to enhance an understanding of the invention. Like reference characters have been used throughout to designate similar components. For purposes of explanation, FIG. 1 depicts a small island 10 comprised of a cooling frame 12 and the interconnection plate or medium 14, for supporting the connectors 16 (FIG. 4) adapted to accommodate the integrated circuit packages 18 (FIGS. 5 and 6) which are preferably the leadless ceramic type described in the reference Morse copending application. In practice, the island may hold as many as 108 connectors in a frame which is aproximately 14 inches by 23 inches. Depending upon the application, even larger islands may be employed. Support members 11 are fastened to opposite sides of the interconnection medium 14. The members are configured with a slotted region 15 to accommodate the "bend" portions of the tubing 50.

Figure 2:
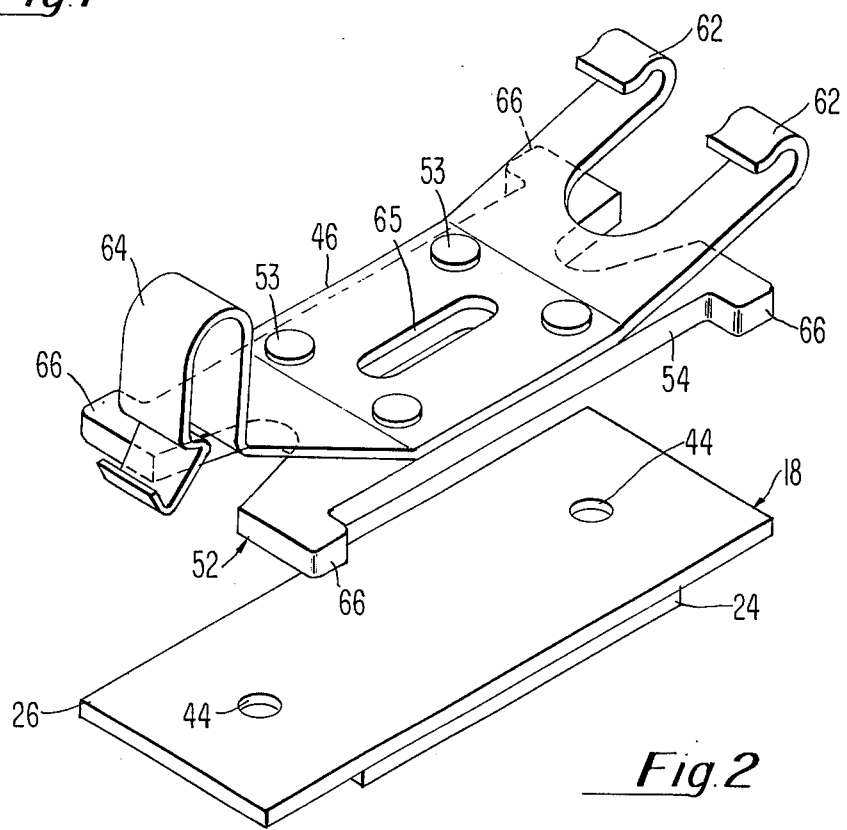
FIG. 2 is an exploded view of the hold down device and an integrated circuit package.

Considering each of the major components in turn and their relationship to one another, the integrated circuit package 18 will receive initial consideration. As seen in clear detail in FIGS. 5 and 6, the total integrated circuit package 18 may comprise a pair of "leadless" pluggable package components 18a and 18b of either SSI or MSI variety, each component having 24 leads 20 plus a ground connection 22. This is the so called "split-package" configuration. It should be understood that a single 50 lead LSI package 18 as indicated in FIG. 2 could also be employed without modification of the package connector 16. In either case, in an actual operative embodiment, the leads are arranged so that half the total number appear on opposite sides of the package, with a typical lead center-to-center spacing of 0.050 inches. As noted hereinbefore, the integrated circuit packages may be of the type described in the referenced copending application. In accordance with the latter and continued reference to FIGS. 5 and 6, the leadless package 18 may utilize a ceramic body 24 having the silicon chip (not shown) hermetically sealed in a cavity formed therein. The internal leads of the package for providing access to the chip are adhered to a layer of glass fused to the ceramic body 24. A carrier or metallic heat sink member 26 is fused to the entire lower surface of the ceramic body. The ceramic between the integrated circuit chip and the heat sink 26 is made sufficiently thin to give good heat conduction while maintaining electrical insulation. The heat sink member 26 has integral extensions at its opposite extremes which are adapted to be clamped against the cooling frame 12 as will be described in more detail hereinafter. In order to provide a ground connection for the integrated circuit, the package ground leads 22 are connected to the package heat sink 26 which provides an electrical path to the cooling frame 12 in addition to the thermal path. A lid or cover 28 which may be of ceramic or a suitable metal alloy protects the integrated circuit chip.

Figure 3:
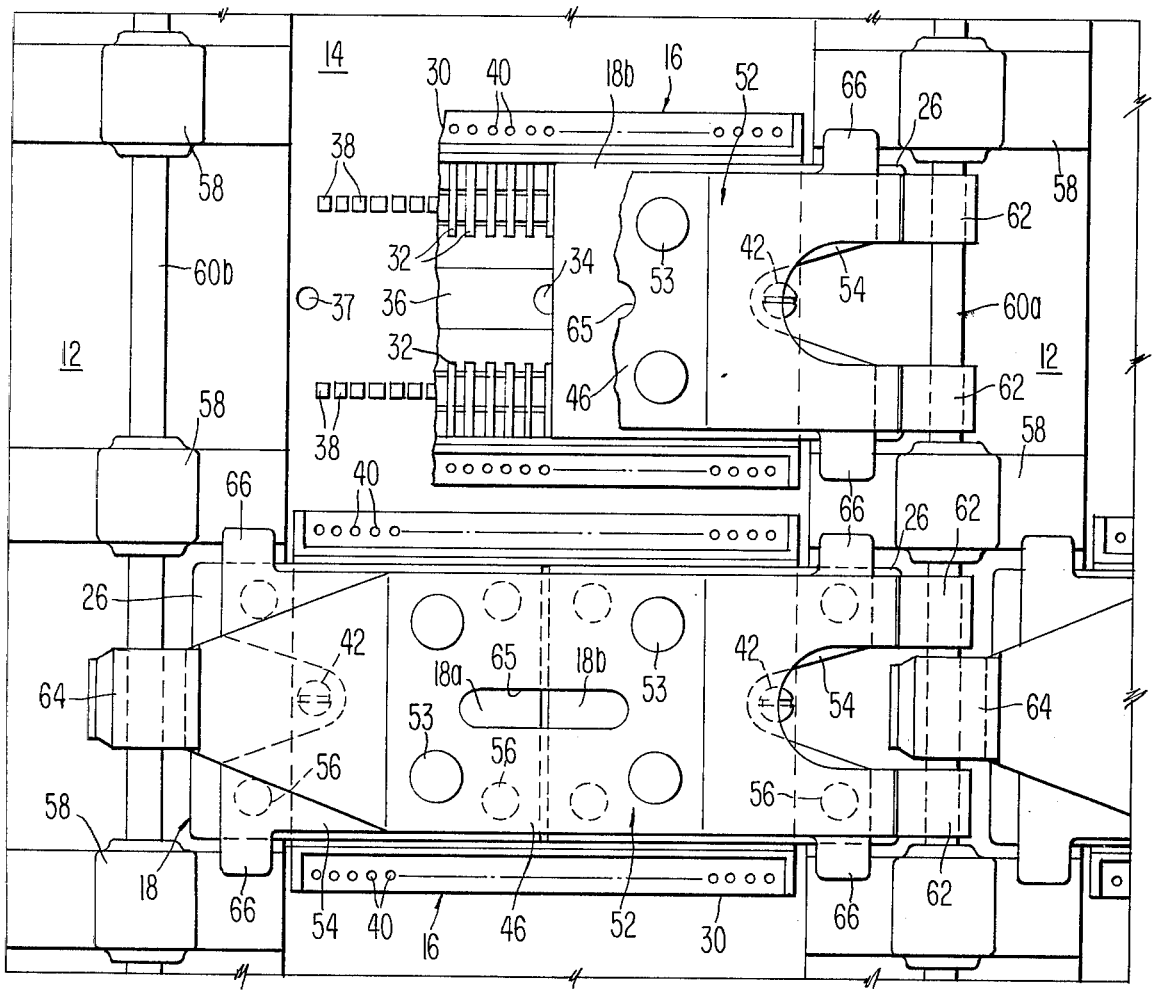
FIG. 3 is an enlarged plan view of part of the island with portions cut-away to better illustrate the relationship of the integrated circuit package, the connector, the interconnection medium, and the hold down device.
Figure 4:
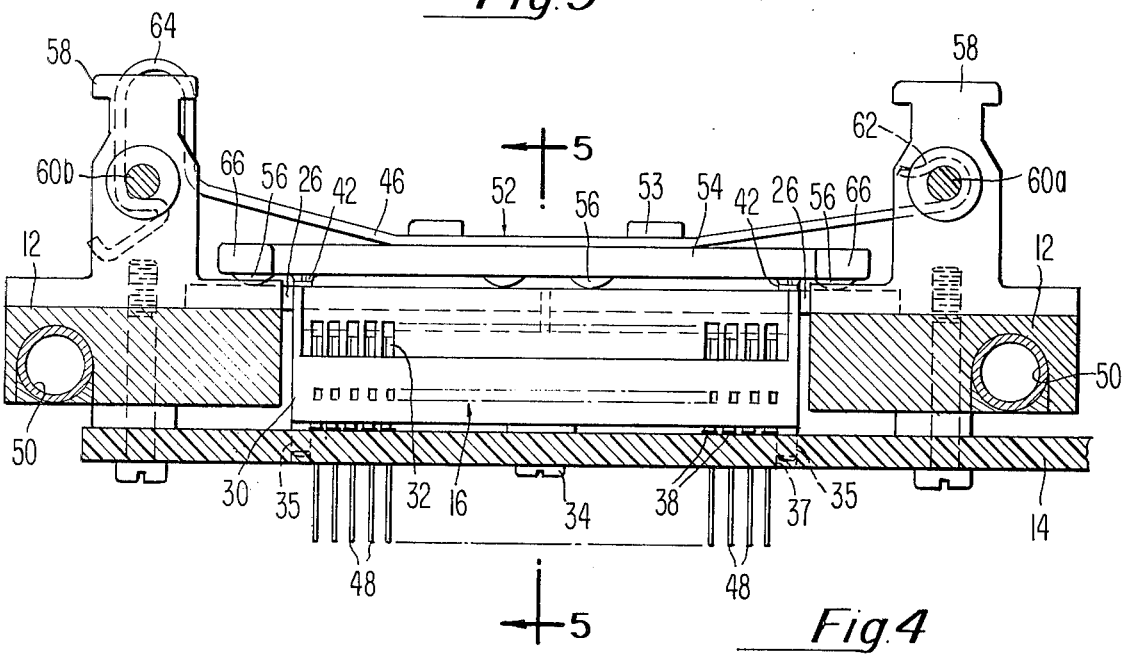
FIG. 4 is a section view taken along lines 4—4 of FIG. 1 and illustrating an integrated circuit package, clamped by the hold down device.
Figure 5:
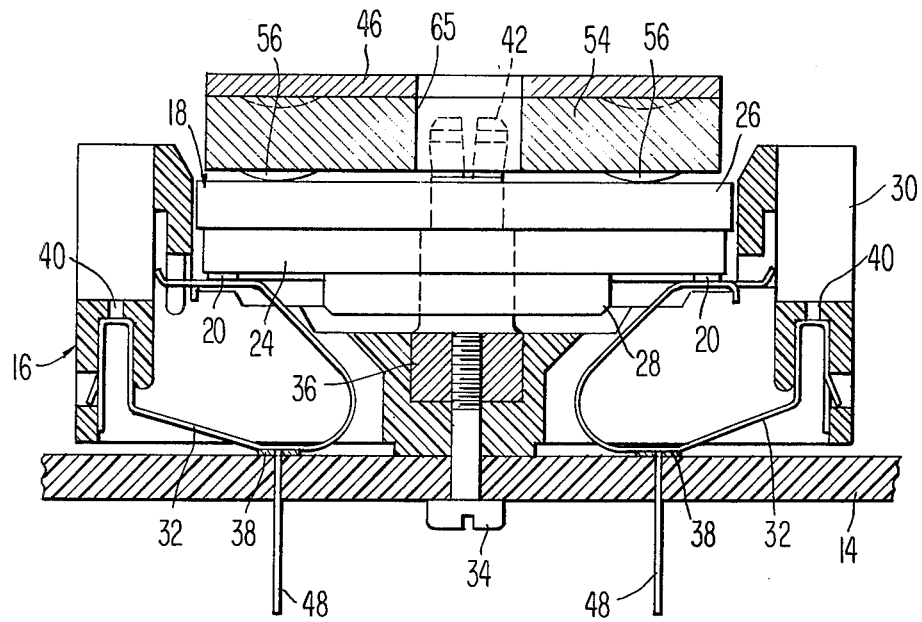
FIG. 5 is a section view taken along lines 5—5 of FIG. 4 and further depicting the relationship of components associated with a single integrated circuit package and the hold down device.

In order to make electrical contact with the terminal portions of the integrated circuit package leads 20, a receptacle or connector 16 as seen in FIGS. 3, 4 and 5, is provided. The connector comprises a molded body 30 of insulative material and a plurality of contacts 32, one for each of the package terminals. Each connector is fastened to the interconnection medium 14 (which may be of the printed circuit board variety) by any suitable means, such as screw 34, threaded into a metallic member 36, as seen in FIG. 5. A pair of locating pins 35 (FIG. 4) situated on the underside of the connector body 30 mate with the holes 37 in the interconnection medium 14. These pins serve to position the lower contact elements 32 over the conductive pads 38. The integrated circuit package 18 which may be of the single large chip variety (FIG. 2), or a pair of split-packages (FIG. 6) are placed in the connector 16. Each contact 32 which is in the form of a continuous loop presses against a terminal lead 20 of the integrated circuit package 18 on its upper portion, and against a conductive pad 38 on the interconnection medium 14, on its lower portion. Additionally, as seen in FIGS. 3 and 5, each contact loop 32 is formed to present a flat portion thereof to circular openings 40 in the connector body located along the longitudinal sides thereof. These openings permit the electrical probing of the contacts while the integrated circuit packages are in place and the system is operative. As seen in FIG. 5, another feature of the connector 16 is the use of a pair of package alignment and retention pins 42. In order to insert the integrated circuit package 18, the split top on each of these pins is gently pressed together in order that the pin may be inserted through the holes 44 provided in the integrated circuit package carrier 26. This arrangement serves to prevent the inadvertent dislodging of the package from the connector particularly when the force exerted by the hold down spring 46 (FIG. 4) to be described in greater detail hereinafter, is suddenly released. As seen in FIG. 5, the connector contacts 32 press against the conductive pads 38 of the interconnection medium 14. These pads in turn may be connected to pins 48 which protrude through the medium and which may then be interconnected by various wiring means, such as wire wrap techniques. Alternately, while not shsown, the aforementioned mode of wiring may be eliminated if the interconnection medium 14 incorporates printed wiring throughout. It is apparent that no holes are required in the interconnection medium 14 to accommodate the connectors 16 themselves. Moreover, no solder art assembly is required. This arrangement provides much freedom in the design of the interconnect medium and a single connector design is compatible with a wide variety of interconnect means.

As seen particularly in FIGS. 1 and 4, a cooling frame 12 is provided to facilitate the transfer of heat from the integrated circuit device 18. The frame 12 is fastened to the interconnection medium 14, which in turn supports the package connectors 16. A cooling liquid is pumped through a continuous tubing 50 in a serpentine path to carry away the heat. Even at moderate coolant flow rates, a nearly uniform fluid temperature is maintained. The nominal temperature of the cooling fluid must be low enough to limit the maximum device junction temperature, and high enough to prevent condensation on the cooling frame 12. As seen particularly in FIG. 4, when the integrated circuit package is placed in the connector 16, the extensions of its heat sink member 26 will tend to come to rest on the cooling frame 12.

With reference to FIGS. 1 – 4 inclusive, and particularly FIGS. 3 and 4, in order to insure both electrical continuity between the connector contacts 32 electrical continuity between the connector contacts 32 and the integrated circuit package leads 20, and the proper thermal interface between the extensions of the package heat sink member 26 and the cooling frame 12, the hold down device 52 of the present invention is provided. The device comprises a spring-like member 46 to which is secured by rivet-like attachments 53 a pressure plate 54, the latter having a number of formed protuberances 56 which bear against the package heat sink member 26. The hold down device 52 is positioned between adjacent members of the cooling frame 12 by virtue of groups of elevated brackets 58 fastened to the frame 12 and each group supporting a common rod 60 which passes therethrough. One end of the hold down spring-like member 46 is notched in a U-shaped configuration such that the extremities of the legs 62 of the U are wrapped around the rod 60a to prevent the hold down device 52 from coming free. The opposite end of member 46 which is a single projection 64 is configured to latch in opposition to the force of spring member 46 with the opposite rod 60b. It should be noted that the latch projection 64 is designed to contact the latter rod 60b and occupy the space formed by the U-notch between the pair of legs 62 of the spring member in the same column and next succeeding row of hold down devices.

In terms of an actual operative embodiment, the connector contacts 32 which are economically of base metals require a high pressure with a force of approximately 14 pounds per split package (18a or 18b of FIG. 6) or 28 pounds per location for the package of FIG. 2 to insure electrical continuity. Moreover, in order to maintain a thermal interface of 1/100 psi between the integrated circuit package 18 and the cooling frame 12, an additional 18 pounds load is required per split package. Considering tolerance take up, the hold down device 52 provides 35 pounds per split package or 70 pounds per location.

Figure 6:
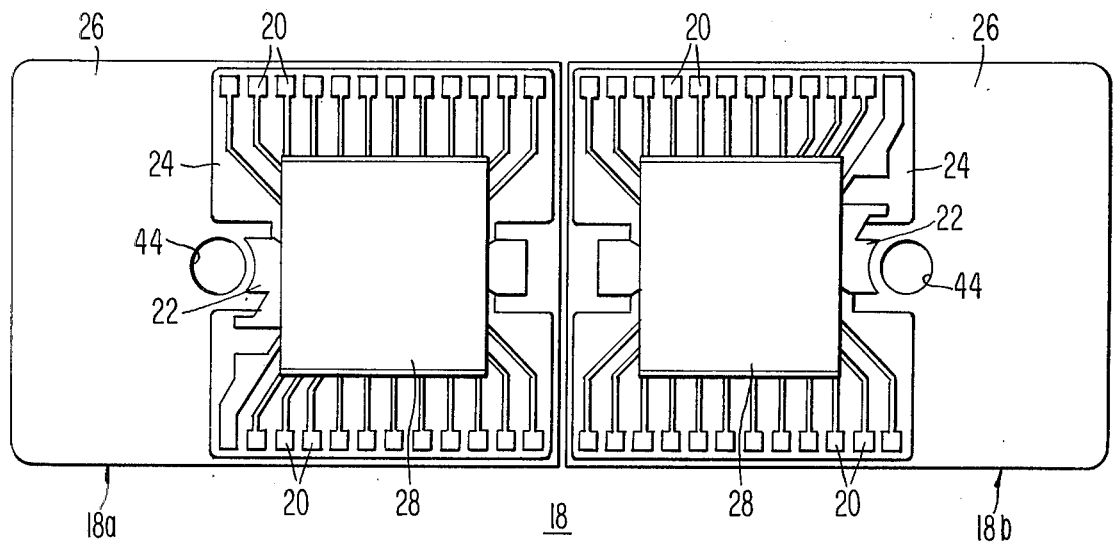
FIG. 6 is a plan view of an integrated circuit package of the "split-package" variety, which comprises a pair of integrated circuits adapted to plug into a single connector.

The hold down device 52 operates properly if only one of the split packages of FIG. 6 is inserted into the connector 16. This is accomplished by the "ears" 66 on the pressure plate 46 which restrains downward motion of the latter even if no package is in place in the connector. The hold down device 52 itself is contained at all times by virtue of the legs 62 wrapped around rod 60 (FIG. 1) and this is important since high insertion and release forces are involved. However, the device is able to swing clear by rotation of the spring 46 about rod 60, thereby facilitating the removal and insertion of packages. Only a simple tool, such as a screwdriver, is needed to latch and release the hold down mechanism.

As seen in FIGS. 1 and 2 both the spring member 46 and the pressure plate 54 have a common elongated slot 65. Through the latter, there is visible at all times, the type designation of the integrated circuit which has been placed on the upper surface of the heat sink member 26. In a system employing a large number of integrated circuits of different logic types, the ability to determine the location of each type while the packages are clamped in position and the system is operative, is of considerable importance in diagnostic and maintenance procedures.

Figure 7:
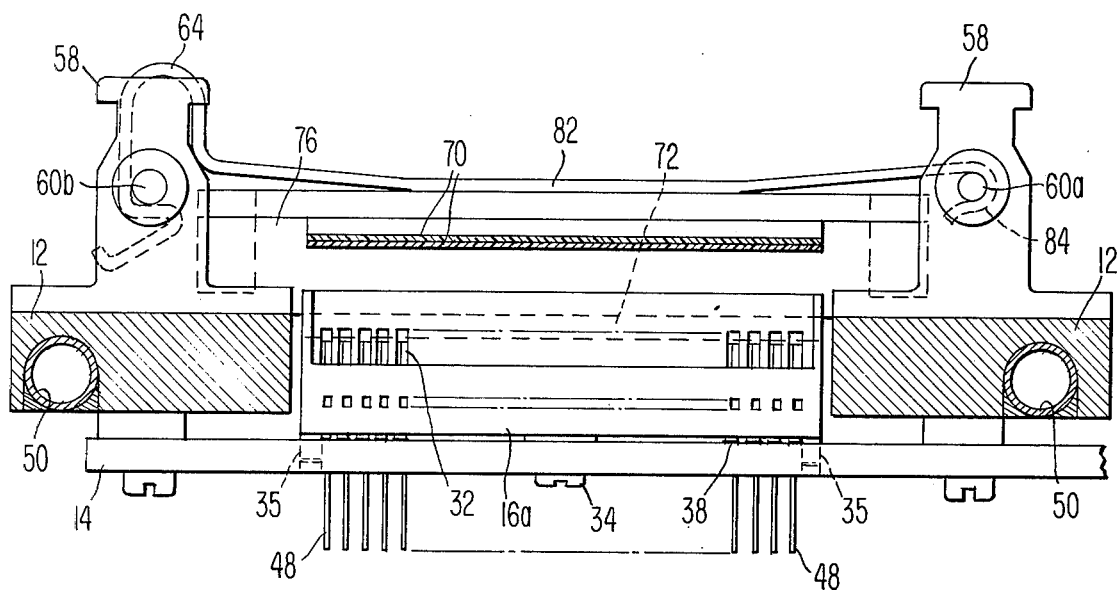
FIG. 7 is a section view taken along lines 7—7 of FIG. 1 to illustrate the use of the hold down device modified to clamp interconnect cables and a termination board into a standard connector.
Figure 8:
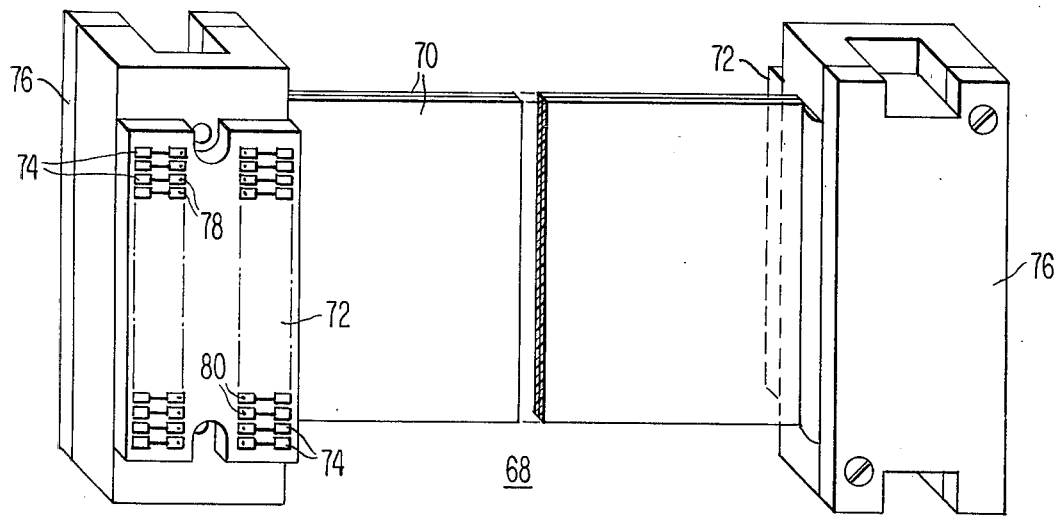
FIG. 8 is a pictorial view of the ribbon-type interconnect cables and the termination assemblies at each end thereof.

In the consideration of the invention thus far, the island 10 of FIG. 1 has been described as having integrated circuit packages 18 mounted in the connectors 16. However, connector 16a (FIG. 7) has been arbitrarily chosen for purpose of example, to accept an interconnect cable assembly 68 (FIG. 8) instead of such a package. This arrangement permits input and/or output signal information to be transferred from the island 10 to other islands or to electrical devices which may be included in, or are external to, the system. The cable assembly comprises a pair of ribbon-type cables 70 each having a plurality of conductors, a termination board 72 with a plurality of conductive pads 74 and the board housing 76. The termination board pads 74 correspond in number and position to the contacts 32 of the connector 16. The number of conductors in each of the cables 70 is chosen to be the same as the number of contacts on one side of the connector. For convenience, the conductors at one end of a cable may be terminated at points 78 along one side of the board, while the conductors at the corresponding end of the other cable may be terminated at point 80 along the opposite side of the board 72. The termination board housing 76, seen in FIGS. 1, 8 and 9, is considerably thicker than the integrated circuit package 18 seen in FIGS. 4 and 5. For this reason, the hold down device 52 illustrated in the last mentioned figures is modified as seen in FIG. 7. No pressure plate 54 is required, and the spring member 82 has a more shallow contour. To accommodate the increased thickness of the termination board housing 76, the legs 84 of the device are wrapped about rod 60 in a direction opposite to that of the integrated circuit package hold down device 52. It should be understood that in accordance with the particular application and the package wiring scheme effected on pins 48 (FIG. 4), the interconnect cable assemblies 68 may be plugged into any connector position on an island. Moreover, more than one assembly may be utilized between the various islands.

In conclusion, there has been described a hold down device suitable for incorportion into the packaging technology needed for present high speed electronic systems, such as data processing, as well as the next generation systems. It is apparent that depending upon the particular application, changes and modifications of the device may be required. Such changes and modifications, insofar as they are not departures from the true scope of the invention, are intended to be covered by the claims appended hereto.

We claim:
1. A hold down device for use in a system which includes at least one electronic component installed in a connector and which incorporates a cooling frame comprising:
   a plurality of bracket means mounted adjacent said cooling frame for supporting a plurality of spaced-apart parallel rods,
   said connector being located in the space between an adjacent pair of rods,
   a spring-like member formed in a shallow, upright, truncated V configuration, one end of said spring-like member being centrally notched in a U-shaped configuration such that the extremities of the legs of the U are pivotally wrapped around one of said pair of spaced-apart rods, the opposite end of said member being configured in a manner to latch on the other of said pair of rods in opposition to the force of said spring-like member exerted on said electronic component,
   said spring-like member being disposed in substantial alignment with said electronic component whereby the latching of said member applies a force to said component of sufficient magnitude to insure elec- trical continuity between said component and connector.

2. A hold down device as defined in claim 1 wherein at least one electronic component is an interconnect cable assembly having a termination board with a plurality of conductive pads and a board housing, said spring-like member making contact with, and exerting a force upon, said board housing when in a latched condition.

3. A hold down device as defined in claim 1 characterized in that a plurality of electronic components installed in connectors are arranged in rows and columns, said cooling frame being configured such that parallel sections thereof separate adjacent ones of said rows, said bracket means being fastened to said cooling frame parallel sections to provide said spaced-apart parallel rods, the latch ends of the respective spring-like members associated with a row of electronic components engaging a common rod and lying respectively between the space provided by the U notches of the pairs of legs of the spring-like members in the adjacent row of components, which legs are wrapped around said last mentioned rod.

4. A hold down device as defined in claim 1 wherein at least one electronic component is an integrated circuit package which includes a heat sink member, said heat sink member having integral extensions at its opposite extremes for contacting said cooling frame.

5. A hold down device as defined in claim 4 further including a pressure plate fastened to the central portion of said spring-like member, and having a plurality of protuberances formed therein to apply substantially equal pressures to the heat sink member surface of said integrated circuit package, thereby insuring thermal continuity between said member extensions and said frame.

6. A hold down device as claimed in claim 5 wherein said pressure plate has at each of its opposite extremities a centrally disposed U-shaped notch, the notch at one end of said plate being in substantial vertical alignment with the corresponding notch in said spring-like member.

7. A hold down device as defined in claim 6 wherein at least one integrated circuit package is of the split-package type comprising two sections each bearing an independent integrated circuit and having a heat sink member extension at one extremity thereof, said pressure plate being generally of rectangular configuration but having ear-like projections at the respective corners thereof, said projections contacting the base of said bracket means when said hold down device is in a latched condition and permitting the clamping of a single one of said split package sections in said connector in the absence of the other section.

8. A hold down device as defined in claim 7 wherein said spring-like member and said pressure plate have a common elongated slot to permit the discernment of any indicia on the upper surface of said package heat sink member while the package is in an operative clamped condition.

* * * * *

UNITED STATES PATENT OFFICE
CERTIFICATE OF CORRECTION

PATENT NO. : 3,942,854
DATED : March 9, 1976
INVENTOR(S) : Peter P. Klein and Robert E. Braun It is certified that error appears in the above-identified patent and that said Letters Patent are hereby corrected as shown below:

Column 5, lines 1 and 2 delete "electrical continuity between the connector contacts 32";

Column 5, line 34, "1/100" should read --100--.

Signed and Sealed this

Twentieth Day of July 1976

[SEAL]

Attest:

RUTH C. MASON
Attesting Officer

C. MARSHALL DANN
Commissioner of Patents and Trademarks